US009766385B2

(12) United States Patent
Boonekamp et al.

(10) Patent No.: US 9,766,385 B2
(45) Date of Patent: Sep. 19, 2017

(54) ILLUMINATION DEVICE WITH WAVEGUIDE AND LEDS (75) Inventors: Erik Paul Boonekamp, Utrecht (NL);
Willem Lubertus Ijzerman, Oss (NL);
Michel Cornelis Josephus Marie Vissenberg, Roermond (NL); Teunis Willem Tukker, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 368 days.

(21) Appl. No.: 13/704,716

(22) PCT Filed: Jun. 10, 2011

(86) PCT No.: PCT/IB2011/052544
§ 371 (c)(1),
(2), (4) Date: Dec. 17, 2012

(87) PCT Pub. No.: WO2011/158160
PCT Pub. Date: Dec. 22, 2011

(65) Prior Publication Data
US 2013/0094240 A1 Apr. 18, 2013

(30) Foreign Application Priority Data

Jun. 17, 2010 (EP) .................................... 10166243

(51) Int. Cl.
*F21V 13/02* (2006.01)
*F21V 8/00* (2006.01)
(Continued)

(52) U.S. Cl.
CPC .............. *G02B 6/0006* (2013.01); *F21S 8/00* (2013.01); *F21V 13/02* (2013.01); *G02B 6/0001* (2013.01);
(Continued)

(58) Field of Classification Search
CPC ... F21V 7/0091; F21V 13/02; G02B 27/0927; G02B 19/0028; G02B 19/0066;
(Continued)

(56) References Cited

U.S. PATENT DOCUMENTS 5,810,463 A * 9/1998 Kawahara ................ F21K 9/00
250/227.2
6,464,366 B1 10/2002 Lin et al.
(Continued)

FOREIGN PATENT DOCUMENTS

CN 201170498 Y * 12/2008
CN 101718407 A * 6/2010 ................ F21V 5/04
(Continued)

*Primary Examiner* — Anh Mai
*Assistant Examiner* — Arman B Fallahkhair (57) ABSTRACT The invention relates to an illumination device (1) comprising an optical waveguide (2) and a number of (connections for) light sources (3)—especially LEDs—positioned along the waveguide (3). This waveguide has a central axis (4) at a distance r to the surface of the waveguide, said surface comprising a light entrance surface (6) on which the (connections for) light sources are positioned and a curved light exit surface (5), wherein, viewed along the circumference of the curved surface (5), the distance r to a first intersection (8) between the flat surface (6) and the curved surface (5), changes to a second distance of different value at the second intersection (9) between said surfaces. The invention also relates to a luminaire comprising such an illumination device (1). Due to the special design of the waveguide (2), the amount of reflections of light in the light sources is largely reduced and desired shaping of the exiting beam can be realized. The device can be further improved by the use of special features, like specially designed curved surfaces (5), reflective structures (13), channels (15) and torus-shaped waveguides.

19 Claims, 8 Drawing Sheets (51) Int. Cl.
*F21S 8/00* (2006.01)
*H01L 33/58* (2010.01)
*F21Y 113/00* (2016.01)
*F21Y 103/10* (2016.01)
*F21Y 115/10* (2016.01)
*F21Y 103/33* (2016.01)
*F21Y 113/17* (2016.01)

(52) U.S. Cl.
CPC ....... *F21Y 2103/10* (2016.08); *F21Y 2103/33* (2016.08); *F21Y 2113/00* (2013.01); *F21Y 2113/17* (2016.08); *F21Y 2115/10* (2016.08); *H01L 33/58* (2013.01)

(58) Field of Classification Search
CPC ...... G02B 3/06; G02B 6/0001; G02B 6/0018; G02B 6/0006; G02B 6/002; G02B 6/0045; H01L 33/58; F21S 8/00
USPC .... 385/121, 25, 32; 362/559, 551, 555, 346, 362/347, 65, 84, 26, 216, 234, 241, 335, 362/326, 334
See application file for complete search history.

(56) References Cited

U.S. PATENT DOCUMENTS

| | | | |
|---|---|---|---|
| 6,783,269 B2 | 8/2004 | Pashley et al. | |
| 6,874,924 B1 | 4/2005 | Hulse et al. | |
| 6,910,783 B2* | 6/2005 | Mezei et al. | 362/615 |
| 7,147,356 B2* | 12/2006 | Tamaki | 362/551 |
| 7,160,012 B2* | 1/2007 | Hilscher et al. | 362/555 |
| 7,581,862 B2* | 9/2009 | Stefanov | F21S 48/1241 362/551 |
| 7,585,097 B2* | 9/2009 | Goto | G02B 6/001 362/297 |
| 7,618,157 B1 | 11/2009 | Galvez et al. | |
| 7,688,400 B1* | 3/2010 | Schellhorn et al. | 349/65 |
| 7,712,918 B2* | 5/2010 | Siemiet | F21S 4/28 362/241 |
| 7,855,815 B2* | 12/2010 | Hayashide et al. | 358/484 |
| 8,075,147 B2* | 12/2011 | Chaves et al. | 362/84 |
| 8,256,918 B2* | 9/2012 | Chaves | G02B 6/0096 362/216 |
| 8,331,755 B2* | 12/2012 | Chang | 385/146 |
| 8,998,478 B2* | 4/2015 | McCollum | F21S 8/06 362/147 |
| 9,016,893 B2* | 4/2015 | Meng | F21V 17/002 362/223 |
| 2006/0139946 A1 | 6/2006 | Tamaki | |
| 2006/0171137 A1* | 8/2006 | Tamaki | 362/26 |
| 2009/0147536 A1 | 6/2009 | Lai | |
| 2009/0161359 A1 | 6/2009 | Siemiet et al. | |
| 2011/0141761 A1* | 6/2011 | Linke | G05G 1/015 362/559 |
| 2014/0286048 A1* | 9/2014 | Riello | G09F 13/18 362/608 |

FOREIGN PATENT DOCUMENTS

| | | | |
|---|---|---|---|
| CN | 201547537 U | * | 8/2010 |
| JP | 2004014122 A | | 1/2004 |
| TW | 200933076 A | | 8/2009 |
| WO | 0039501 A1 | | 7/2000 |
| WO | 2009064472 A1 | | 5/2009 |
| WO | 2010061318 A1 | | 6/2010 |

* cited by examiner

ILLUMINATION DEVICE WITH WAVEGUIDE AND LEDS

FIELD OF THE INVENTION

The invention relates to an illumination device comprising an optical waveguide and one or a number of (connections for) light sources positioned along the waveguide, said waveguide having a central axis at distance r to the surface of the waveguide, said surface comprising a light entrance surface on which the (connections for) one or number of light sources are positioned and a curved light exit surface. During operation of the device, said two surface types enable light generated by the light sources to enter via the entrance surface into the waveguide and enable light to exit via the exit surface. The invention also relates to a luminaire comprising an illumination device.

BACKGROUND OF THE INVENTION

An illumination device as described in the previous paragraph is known. For example, U.S. Pat. No. 6,874,924 discloses a device with an elongated and substantially cylindrical waveguide, which is at a distance r from an imaginary central axis (not shown). The waveguide has a light-emitting outer surface and an interior semi-reflective portion spaced at a predetermined distance from the light-emitting outer surface. A channel is defined through a portion of the waveguide along its length. In the channel, light sources formed as LEDs are positioned. Light generated by these LEDs enters the waveguide through one or both of the flat side walls defined by the channel. The entered light is scattered in the waveguide and emitted via its curved outer surface. In the disclosed illumination device, the light is emitted substantially homogeneously and with uniform light intensity from the outer surface.

The known illumination device shows several disadvantages. A first disadvantage concerns the problem of back-reflection of light into the LEDs. Due to the design of the waveguide, a large part of the light generated by the LEDs and entered into the waveguide via the flat entrance surface (s) of the channel is reflected back into the LEDs. During operation of the illumination device, such back-reflections cause considerable optical loss. A second disadvantage concerns device costs. The devices according to the known design need additional measures causing light scattering in order to produce sufficient output and uniform light emission. Due to these additional measures, the prior art illumination devices are rather expensive. Finally, with illumination devices according to the disclosed construction, desired beam shaping can hardly be realized or not at all.

SUMMARY OF THE INVENTION

The present invention aims at providing an illumination device according to the opening paragraph, in which at least one or more of the disadvantages are mitigated or preferably completely absent. The invention especially aims at providing an illumination device of the above described type in which the problem of back-reflection of light into the light sources, especially LEDs, is mitigated. The invention also aims at providing an illumination device of the above described type with which beam-shaping can be realized. A further object of the current invention is to provide an improved luminaire that comprises an illumination device as described in the opening paragraph.

According to a first aspect of the invention, an illumination device is provided comprising an optical waveguide and a number of (connections for) light sources positioned along the waveguide, said waveguide having a central axis at a distance r to the surface of the waveguide, said surface comprising a light entrance surface on which the (connections for) light sources are positioned and a curved light exit surface, wherein, viewed along the circumference of the curved surface, the distance r to a first intersection between the entrance surface and the curved exit surface, and to a second intersection between said surfaces have a different value.

The invention is inter alia based on the recognition that waveguides having a non-circular circumference provide new possibilities for illumination devices. In such waveguides, entrance surfaces can be designed in such a manner that, during operation of the device, the amount of light reflected into the light sources is largely diminished or even completely absent. Moreover, the use of waveguides with a non-circular circumference of the curved surface in illumination devices provides the possibility of modifying the light exiting the curved surface into a desired beam shape. Said feature can be achieved by providing a specific shape to the curved surface of the waveguide. Regarding the expression 'curved surface' it is noted that the surface can be curved in a continuous way or in a discontinuous way. In the latter situation, a large number of flat segments can form a curved surface. Combination of a continuous and a discontinuous curved exit surface is also possible. In view of the manufacture of the waveguide, a continuously curved surface is preferred.

Light entering a waveguide having the above-described configuration travels in a spiral pattern through the tube and leaves the tube after a number of reflections at the curved surface. When light travels through the waveguide, each reflection changes the angle of the light ray until the total internal reflection (TIR) condition is not fulfilled anymore. In such a situation, the light escapes from the waveguide via the curved exit surface. The mean number of circulations of the light in the tube depends on the specific shape of the curved surface. The spiral pattern of the light rays lies largely in a plane which is substantially perpendicular to the axis of the waveguide. However, during the spiral motion of the light, part of the light entered into the waveguide also spreads out in the longitudinal direction of the waveguide. In the case that a number of light sources are positioned at a short distance from one another, this 'spread out' effect causes mixing of the light generated by different light sources. When using light sources which emit different colors, said spread out effect causes color mixing. This effect is especially present when using LEDs as light sources.

In principle, all kinds of light sources can be used in the illumination device according to the invention, like incandescent light sources or fluorescent tubes. However, the use of small light sources is preferred. This holds especially for organic light emitting diodes (OLEDs), while inorganic light emitting diodes (LEDs) are even more preferred. For that reason, the invention is explained in more detail using LEDs, especially in the embodiments. The waveguide in the invented luminaire comprises electrical connections for electrically connecting the light sources, especially the LEDs. In the invented luminaire, the light sources may or may not be inserted in the electrical connections. The expression "(connections for) light sources" is used to indicate this situation.

The waveguide of the invented illumination device comprises a central axis. In the case that the outer surface of the waveguide follows a regular spiral form, said central axis can be defined by means of the spiral form. This is especially the case when using an Archimedean spiral form. In that case, the axis can be defined by means of the starting point and the end point of the spiral (vide infra). In the case that the axis cannot be defined in that way, for example in the case of an irregular outer surface of the waveguide, said central axis is defined as the mass central line of the waveguide.

The light entrance surface can have different shapes. It can be segmented or facetted or have a so-called battlement structure or stepped structure. However, a flat entrance surface is preferred in view of its relatively simple manufacture.

An interesting embodiment of the illumination device according to the invention has the feature that the tangent to the curved surface at both intersections is parallel to the normal to the entrance surface. This feature causes the light generated by the light sources positioned on the entrance surface to enter the waveguide at such an angle that, due to total internal reflection, the entering light travels virtually in its entirety in a spiral pattern through the waveguide. This holds especially for LEDs. Due to multiple reflections in the tube, the initial high brightness of the LEDs is dramatically reduced. It is noted that this effect works sufficiently if the tangent deviates less than 20° from the ideal parallel configuration. So, deviations within this range are considered to fall within the scope of this embodiment. If the tangent deviates more than 20° from the ideal configuration, too much of the entering LED light exits the waveguide without circulation in said waveguide. As a result, unwanted glare caused by the direct LED light is insufficiently diminished. Preferably, the tangent is within 10° of the ideal configuration where it is completely parallel to the normal to the flat surface.

Another interesting embodiment of the invented illumination device shows the characteristic that the distance r measured along the curved surface circumference continuously changes from said first distance to said second distance. Compared to curved surfaces showing an irregular circumference, illumination devices having said characteristic have the advantage that the circulation of the entering LED light in the waveguide is enhanced. This means that, in this preferred embodiment, the average number of light circulations is higher than in waveguides of which the curved surface has an irregular shape.

Especially desired is the embodiment of the invented device in which at least part of the curved exit surface corresponds to the equation $r(\theta)=a+b\theta$, when describing said surface in polar coordinates. Said equation describes a specific spiral form type, also known as the Archimedean spiral form. Due to the constant increase of the distance r as a function of the rotation along the curved surface, the highest average numbers of light circulation are reached in illumination devices having a waveguide whose complete curved exit corresponds to the Archimedean spiral form. This advantage is especially seen when using LEDs. In this situation, the brightness or glare of the LED is largely diminished, without using classical light scattering means.

In a further interesting embodiment of the invented device, at least part of the curved exit surface corresponds to the equation $r(\theta)=a+\theta[b+c.\exp(-d.(\phi-\theta)^2)]$, when describing said surface in polar coordinates. Illumination devices of this preferred type are found to comprise a 'protrusion' part along the waveguide. Said protrusion part is added to the spiral form and is characterized by means of the parameters c, d, and $\phi$. By means of changing these parameters, a change in shape and position ($\phi$) of the exiting beam from the waveguide is obtained.

In another interesting illumination device according to the invention, the waveguide is provided with a light reflective structure. This structure provides additional means to influence the shape and position of the light exiting the waveguide. Said reflective structure can be embodied as a slit made in the waveguide rod or as a molded-in reflector. Good results have been attained with flat surfaces on the circumference of the waveguide. Such flat surfaces are preferably provided with a reflecting material, like sputtered or evaporated metals, such as silver or aluminum, of which the latter is preferred. Good results have also been obtained with the use of reflecting plates or sheets. Good examples are an aluminum plate from the firm Alanod (Miro plate) or an ESR sheet from the firm 3M. Such plates or sheets can be attached to the reflective flat surface by means of known techniques, like clamping.

Interesting is also the embodiment of the invented illumination device in which the waveguide comprises two light entrance surfaces, said surfaces being located at substantially opposite locations of the waveguide. It is stressed that also in this preferred design, no back-reflections of light into the light sources can occur. This is especially advantageous when using LEDs. With this design, higher light inputs into the waveguide are possible. Depending on the specific shape of the curved surfaces, special beam profiles can be designed, like an 'up' and a 'down' beam in one waveguide. It is especially useful to apply such waveguides in luminaires with (inseparable) 'up lighter' and 'down lighter' functions.

A further advantageous embodiment of the illumination device in which the invention is embodied comprises a channel extending substantially parallel to the central axis. The surface of such a channel may be provided with scattering means, like prisms, paint, a printed pattern, a film etc. In principle, the channel can have any form. In other words, its contact surface with the waveguide may have a circular form, oval form, square form, etc, when viewed in a cross section normal to its axis. Preferably, the axis of the channel and the central axis of the waveguide do not coincide. In said situation, the channel can be used for effective interaction with the light traveling through the waveguide. Due to its asymmetric position in the waveguide, the channel can be used to force the light into a 'funnel' where it exits the waveguide.

The waveguides in the invented illumination devices generally will have an oblong shape. By virtue thereof, they can replace TL tubes. An advantageous aspect of the use of these oblong devices is observed when the waveguides are arranged in series, thus forming a straight 'light line'. As most of the light entered into the waveguide circulates in a plane perpendicular to the optical axis of the waveguide, hardly any light can escape at the ends of the waveguides. This is because virtually all light in the waveguide is totally reflected at the flat end surfaces of the waveguides. As a consequence, no dark parts are observed at the connection areas of oblong waveguides that are arranged in series. Thus, waveguides of this type are especially useful in luminaires used for line lighting.

Another important embodiment of the illumination device according to the present invention shows the feature that the waveguide is torus-shaped. Illumination devices with torus-shaped waveguides can be advantageously applied in luminaires that are able to generate LED spot lights with rotationally symmetric light intensity. Such luminaires may contain one or two illumination devices; in the case of one illumination device, said illumination device comprises a torus-shaped waveguide. In the case of two illumination devices, a dual lighting luminaire is available having a ring or oval shaped first waveguide generating a wide, bat-wing shape beam as well as a ring or oval shaped second waveguide generating a narrow beam.

BRIEF DESCRIPTION OF THE DRAWINGS

These and other aspects of the invention will be apparent from and elucidated with reference to the embodiments described hereinafter and illustrated by the Drawing, in which.

It is stressed that, for reasons of clarity, the Figures are schematic and not to scale.

DETAILED DESCRIPTION OF THE EMBODIMENTS

Figure 1:
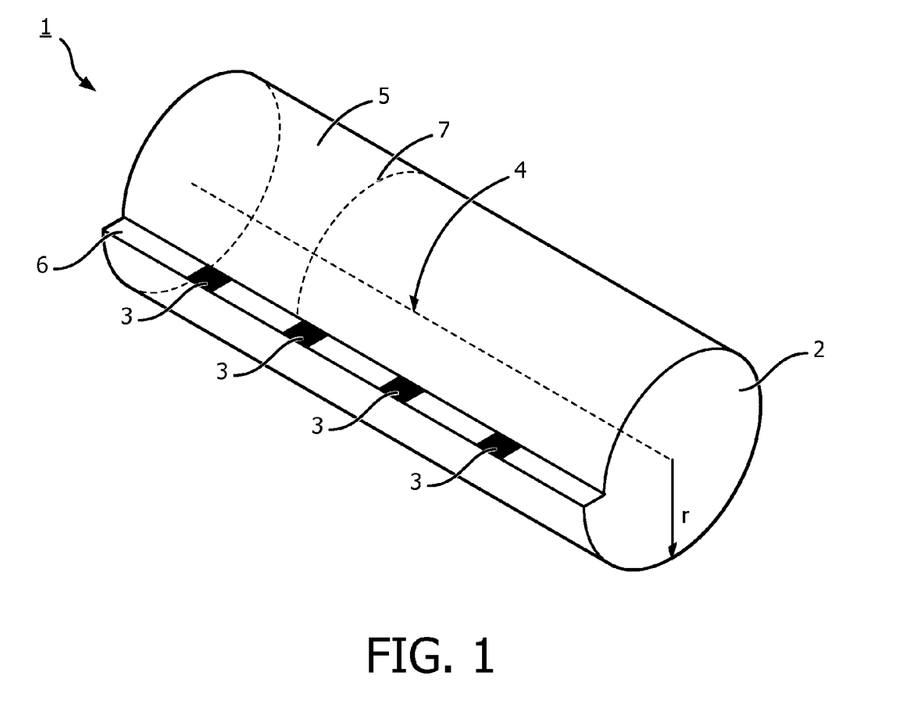
FIG. 1 shows a perspective view of a basic embodiment of the illumination device according to the present invention.

In FIG. 1-A, a basic embodiment of the illumination device (1) according to the present invention is depicted in a perspective view. The device (1) comprises an optical waveguide (2) and a number of light sources formed as LEDs (3). In this and following examples, LEDs are used for explaining the invention, although also other light sources can be used. The LEDs are positioned in electrical connections (not shown), which are electrically connected to circuitry and steering elements, which are well-known in the art. The oblong waveguide can be prepared from any optically transparent material, like glass and quartz, but is preferably made of a polymer material, like PMMA or polycarbonate. It is preferably made as a solid rod by means of extrusion. The solid waveguide (2) has an (imaginary) central axis (4) at a shortest distance r to the surface of the waveguide. This surface comprises a curved surface (5) and a surface (6), being a flat surface in this embodiment. The LEDs (3) are positioned on the flat light entrance surface (6). The mentioned two surface types of the waveguide enable, during operation of the device (1), entrance of light generated by the LEDs via the entrance surface (6) into the waveguide (2) and exit of light via the exit surface (5).

In the present embodiment, a waveguide is used having a length of 30 cm and a diameter r varying between 3.0 and 3.2 cm. A number of domeless RGB-LEDs (3) of the type Luxeon c from Philips Lumileds were contactlessly positioned with the emitter side in near proximity of the flat entrance surface (6). The distance of the LEDs to the nearest neighboring LEDs was approximately 2.0 cm. For reasons of clarity, the printed circuit board and steering electronics for activating the LEDs (3) have been omitted from the drawing. It is noted that the invention can be executed with different types of LEDs, like side-emitters or top-emitters. The flat surface (6) is preferably manufactured so as to extend in a straight line along the waveguide (2), as shown in FIG. 1. It is however possible that the entrance surface (6) meanders or wiggles along the waveguide (2), or even is twisted around it in a helix-like shape. The dotted line (7) indicates a cross section of the waveguide (2), taken perpendicularly to its (imaginary) central axis (4). It is stressed that the different embodiments of the present invention as explained in FIGS. 2-9 and 11 refer to this type of cross section.

Figure 2:
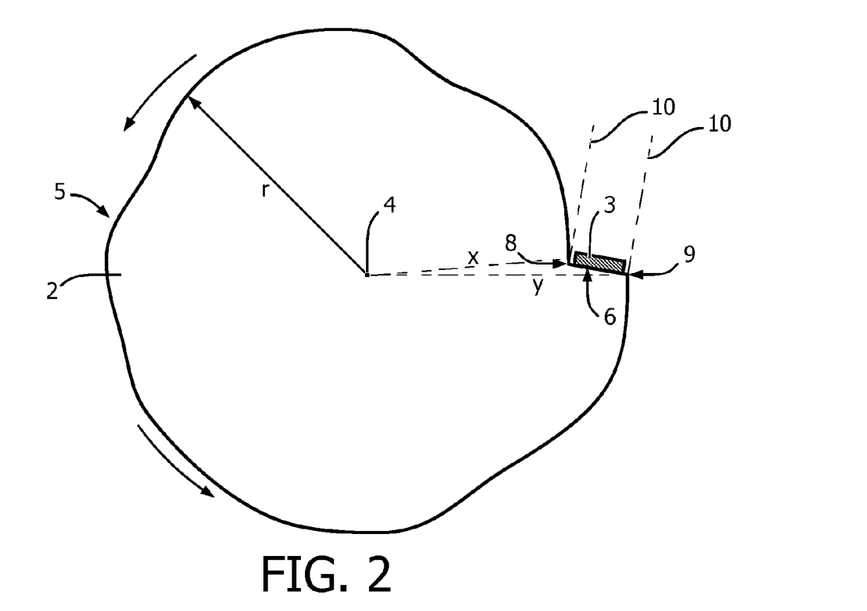
FIG. 2 shows a cross section of a first embodiment of the illumination device according to the present invention.

As stated hereinabove, FIG. 2 shows a schematic cross section taken along the dotted line (7) of the basic embodiment shown in FIG. 1. FIG. 2 clearly shows that the distance r from the central axis to the curved surface (5), when viewed along the circumference of said curved surface (5), is not constant. In this Figure, said distance r increases from a value x at a first intersection (8) between the curved surface (5) and the flat surface (6) to a value y at the second intersection (9) between said two surfaces (5, 6). It is stressed that the increase can be discontinuous and values x and y need not be the minimum and maximum values of r. The schematically indicated LED (3) is positioned on light entrance surface (6). During operation of the illumination device, light generated by LED (3) enters the waveguide (2) via surface (6) and exits said surface, when, after a number of reflections at said surface, the total internal reflection conditions are no longer met. FIG. 2 also clearly shows that, due to the structure of the waveguide (2), light generated by LEDs (3) cannot reflect back into the LEDs (3).

In the embodiment indicated by FIG. 2, the tangents to the curved surface at both intersections (8, 9) are indicated with dotted lines (10). In this embodiment, these tangents (10) are not parallel to the normal to flat surface (6). In the embodiment shown, there is an angle of about 35° between the tangent and the normal to surface (6). Due to this design, a rather large amount of the LED light entering waveguide (2) via surface (6) exits the waveguide after a relatively small number of reflections at curved exit surface (5). In the embodiment schematically shown in FIG. 3, the number of reflections is higher. This is caused by the fact that the waveguide (2) is designed so that the tangent to the curved surface (5) at both intersections (8, 9) is parallel to the normal of the flat surface (6). This means that the angle between said tangent and said normal is less than 20° and preferably less than 10° in order to reach the situation that a maximum number of reflections and rotations are attained within the dimensions of the waveguide.

Figure 3:
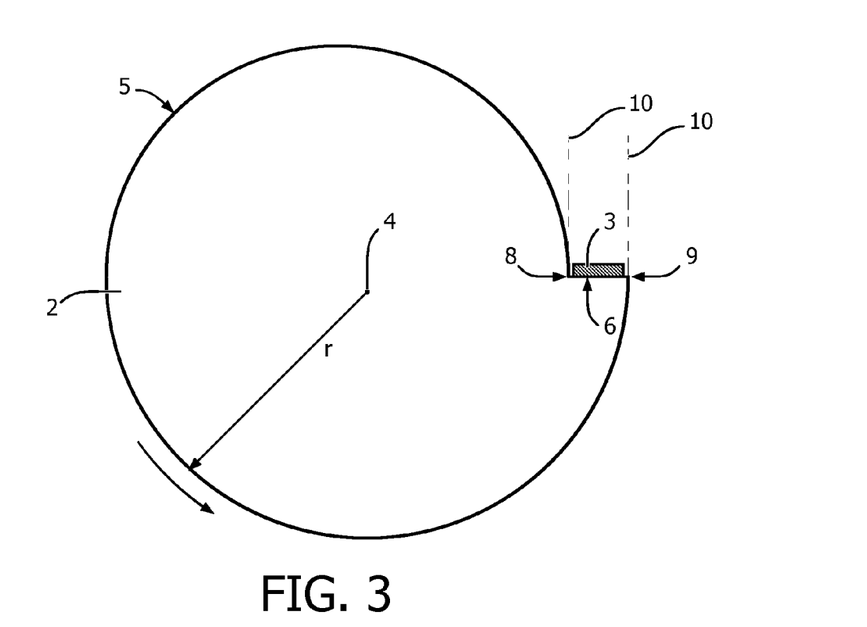
FIG. 3 shows a cross section of a second embodiment of the illumination device according to the present invention.

In the embodiment having the cross section depicted in FIG. 3, the distance r increases continuously from a minimum value x to a maximum value y. These minimum and maximum values are attained at the intersections (8) and (9) respectively. As, in this design, the central axis (4) lies in the plane of the flat surface (6), the equation can be written as y=x+d, with d representing the width of flat surface (6). In practice, width d should have a minimal value of 0.3 mm when side-emitting LEDs are used or a minimal value of 3 mm when LEDs of the front-emitter type are used. Experiments and measurements have shown that, when using a waveguide of the polymer material PMMA (refractive index n being approximately 1.5), the quotient d/y should preferably be less than 0.1. In illumination devices meeting this rule, the LED rays which entered the waveguide will be captured there and transported by TIR. With this rule, skilled persons can calculate all dimensions of preferred waveguides to be used in the illumination device.

In the discussed embodiment shown in FIG. 3, the curved surface (5) is of a special design as it corresponds to the equation $r(\theta)=a+b\theta$, when describing said surface using polar coordinates. As indicated hereinabove, such a configuration of the waveguide (2) provides for a more uniform brightness of the LEDs (3) used, so that the glare in luminaires containing such waveguides (2) is also reduced. This is mainly caused by the large degree of circulation of the rays in the waveguide, while being TIR reflected on curved surface (5). In practice it holds that more reflections mean a more uniform brightness.

Figure 4:
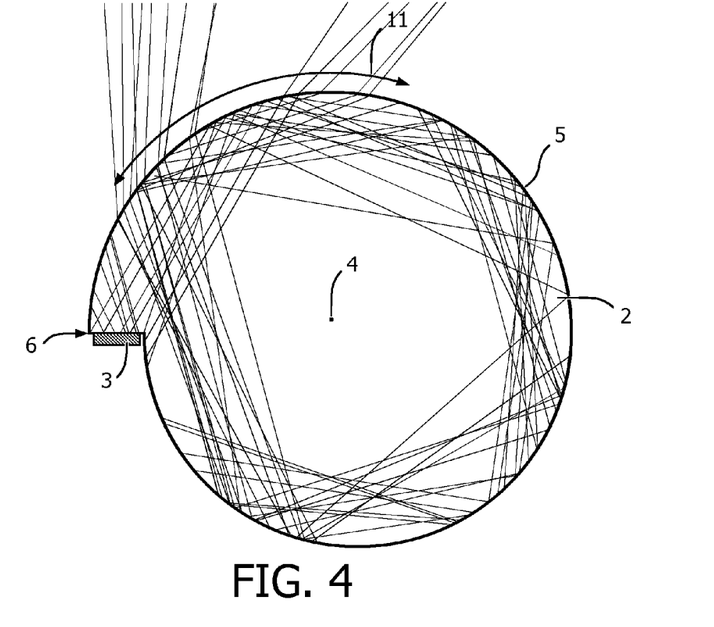
FIG. 4 shows a cross section of a third embodiment of the illumination device according to the present invention.

FIG. 4 schematically depicts the (calculated) path of rays entering the waveguide according to this embodiment of the illumination device. Thus, light rays generated by LED (3) enter the waveguide via flat surface (6) and follow a spiral pattern, causing them to be reflected a number of times at curved surface (5) before they exit the waveguide (2). As the curved surface (5) follows the preferred Archimedean spiral form, the number of reflections is comparatively high. Reference (11) denotes the area of the waveguide in which most of the LED rays exit via the curved surface (5). This Figure shows that the illumination devices do not emit light with a substantially uniform and homogenous radial light intensity pattern, but that a beam is generated. Said beam can be manipulated by using different dimensions and shapes of the device parts, especially the dimensions and shapes of the waveguide (2). As the small light area generated by LED (3) is spread out over a broad area (11), the glare of the illumination device is reduced. It is noted that in this configuration, the manipulation of the beam is rather limited.

Figure 5:
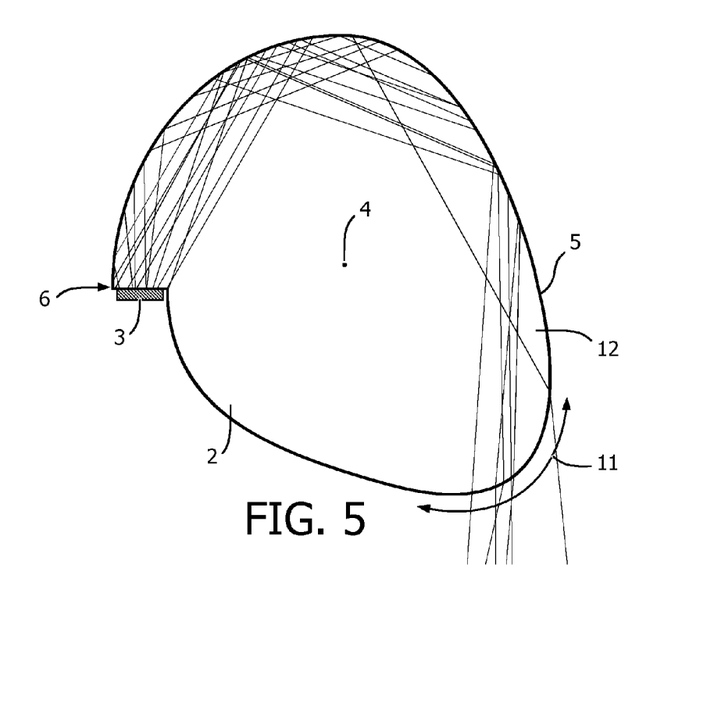
FIG. 5 shows a cross section of a fourth embodiment of the illumination device according to the present invention.

FIG. 5 schematically depicts a cross section of the waveguide (2) of a special embodiment of the invented illumination device. In this example, the curved surface (5) corresponds to the equation $r(\theta)=a+\theta[b+c.\exp(-d.(\phi-\theta)^2)]$, when describing said surface in polar coordinates. In this special embodiment, a=1, b=0.001, c=0.004 and $\phi$=145. The so-obtained curved surface (5) shows a clear protrusion part (12). Due to this protrusion part, virtually all LED rays entering the waveguide (2) via entrance surface (6) exit at protrusion part (12) via the curved surface (5) in area (11). A number of calculated rays are indicated in FIG. 5. By means of particular parameters c, d and $\phi$, it is possible to determine the beam shape and beam position (0) at area (11) where the beam leaves the waveguide (2).

It is stressed that not all light generated by LED (3) is emitted in the plane perpendicular to the waveguide (as shown in FIG. 5). A small part of the light rays is also emitted at a small angle in the waveguide. This part of the light will also reflect at the curved surface (5) and will follow a helix-like pattern. During the reflections, this light will also travel a short distance in the length direction of the waveguide (2). During this travelling, it will mix with the light generated by neighboring LEDs (3). When the neighboring LEDs (3) have a different color, this effect causes color mixing. This effect also enables the colors of 'cool-white' and 'warm-white' neighboring LEDs to be mixed. If neighboring LEDs can be addressed individually, it is even possible to continuously make adjustments between different colors.

Figure 6A:
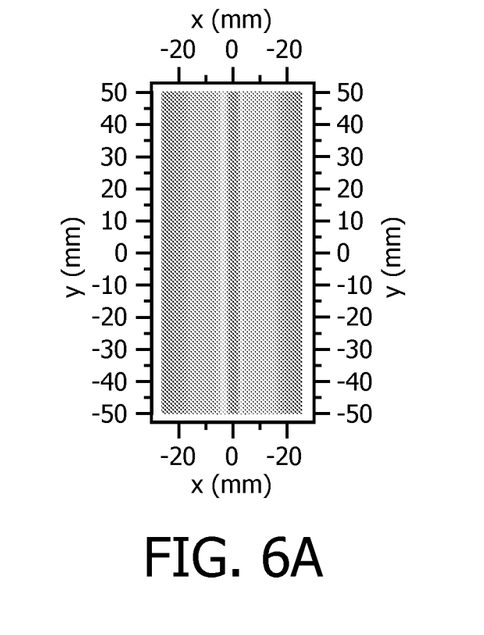
FIG. 6 shows the light uniformity patterns of an illumination device according to the present invention and of an illumination device not according to the present invention.
Figure 6B:
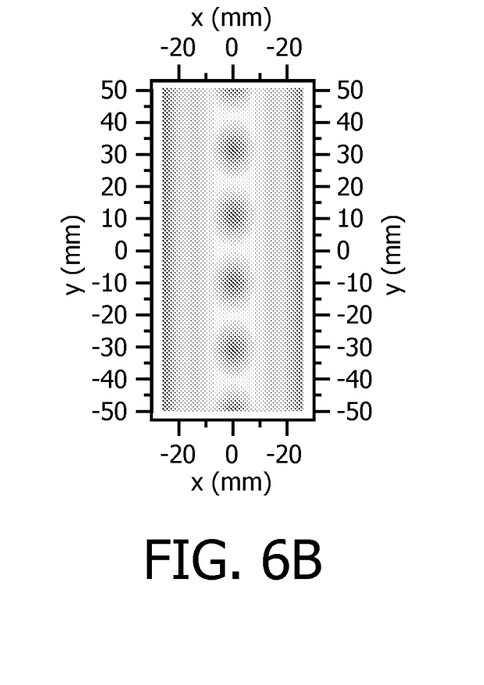

FIG. 6 shows the calculated light uniformity of an illumination device according to the invention (FIG. 6-A) and an illumination device not according to the invention (FIG. 6-B). The device according to the invention contains a waveguide (2) as described in FIG. 5. The device not according to the invention does not contain a waveguide at all. Both devices contain a number of LEDs (3), being positioned at a mutual distance of 2.0 cm. The uniformity of the light is calculated at a distance of 15 cm from the LEDs (3). The light uniformity has been determined both in the length direction x parallel to the oblong waveguide (2) and in the direction y perpendicular thereto. FIG. 6-A shows that the device according to the invention has a high light uniformity along the length of the waveguide (2) and a narrow collimation perpendicular to the waveguide (2). This light uniformity is caused by the light mixing effect described in the previous paragraph. Absence of the waveguide results in an illumination device showing a highly non-uniform illumination pattern (FIG. 6-B). Thus, the illumination device according to the invention results in a reduction of glare and clear beam-shaping possibilities.

Figure 7:
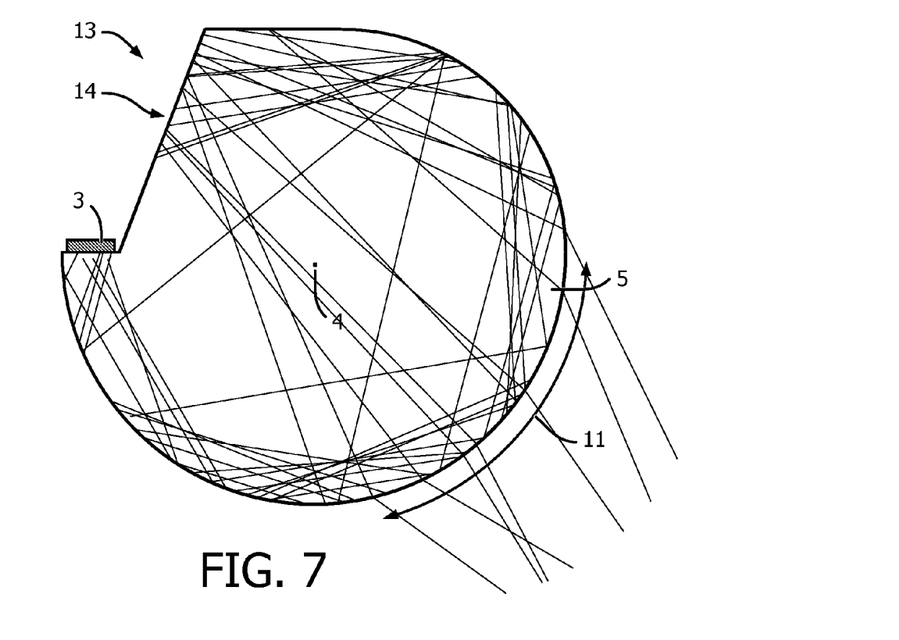
FIG. 7 shows a cross section of a fifth embodiment of the illumination device according to the present invention.

FIG. 7 schematically depicts a cross section of the waveguide (2) of another interesting embodiment of the invented illumination device, comprising a light reflective structure (13). Such a structure can be used for better shaping the beam exiting the waveguide (2). In the shown example, an additional flat surface (14) has been provided on the waveguide (2) along its length. Said flat surface has been provided with reflection means, like a metal layer. In the present example, a sputtered aluminum layer has been provided on said flat surface. Due to the presence of this reflective layer, the light beam generated by LED (3) that exits the waveguide (2) at area (11) during operation of the illumination device is relatively small. It is noted that also other reflective structures can be used in the illumination device according to the invention, like slits in the waveguide (whether or not filled with reflective material), molded-in reflectors or sheets placed in a cavity of the waveguide.

Figure 8:
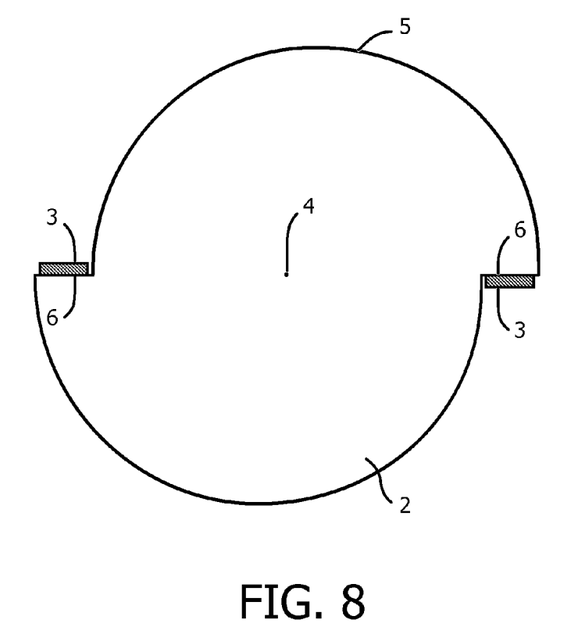
FIG. 8 shows a cross section of a sixth embodiment of the illumination device according to the present invention.

FIG. 8 schematically depicts a cross section of the waveguide (2) of a further interesting embodiment of the invented illumination device. In the waveguide (2) of this embodiment, two flat light entrance surfaces (6) are comprised, said surfaces being located at substantially opposite locations of the waveguide (2). In this embodiment, a double-beam illumination device can be manufactured. In principle, the curved area of this embodiment can have a circular cross section.

Figure 9:
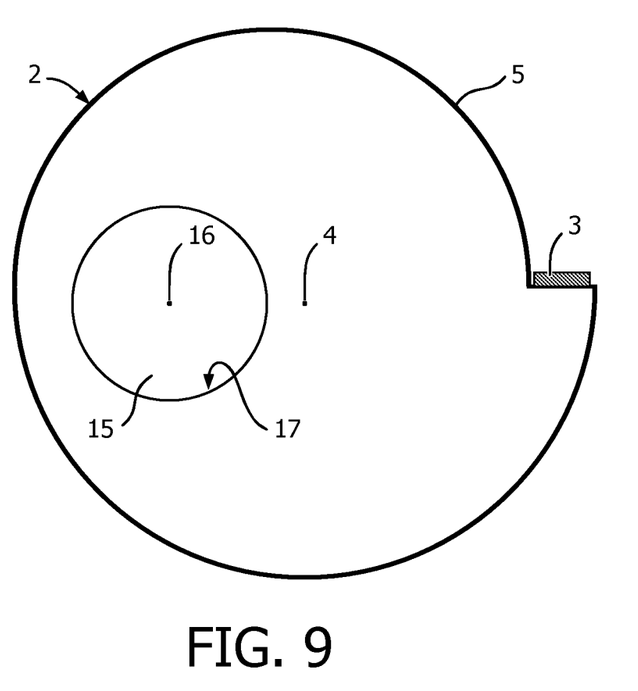
FIG. 9 shows a cross section of a seventh embodiment of the illumination device according to the present invention.

FIG. 9 schematically depicts a cross section of the waveguide (2) of a further interesting embodiment of the invented illumination device. In the device according to this embodiment, the waveguide (2) comprises a channel (15) extending substantially parallel to the central axis. In the preferred example shown, the axis (16) of the channel (15) and the central axis (4) of the waveguide (2) do not coincide. Due to the non-centric position of the channel (15), light inserted into the waveguide (2) by LEDs (3) can be forced into a 'funnel' at the location where it exits the waveguide (2). As a result, this feature is helpful in further shaping the exiting beam from the illumination device. It is stressed that the form of the channel (15) can be freely selected. Thus, its contact surface (17) with the waveguide (2) may have a circular form, oval form, square form, etc, when viewed in cross section at right angles to its axis (4). If desired, the inner side of contact surface (17) may be coated with a paint or film.

Figure 10A:
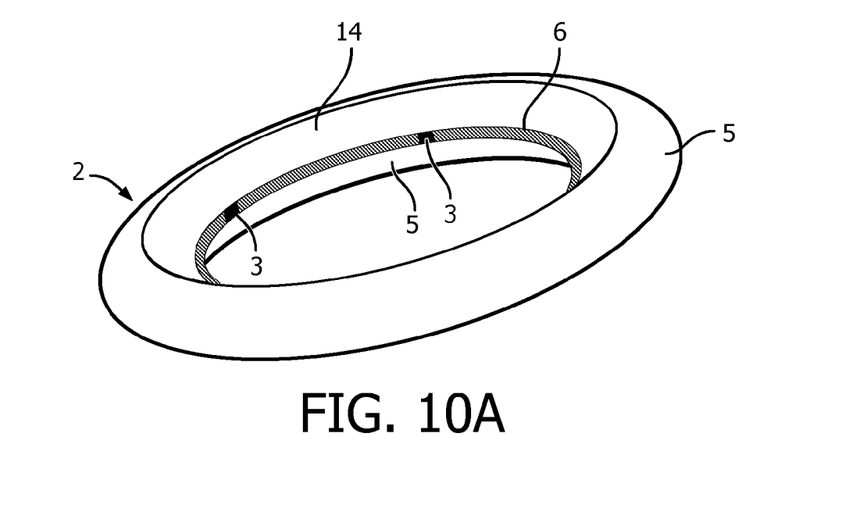
FIG. 10 shows a perspective view of an eighth embodiment of the illumination device according to the present invention and its light profile.
Figure 10B:
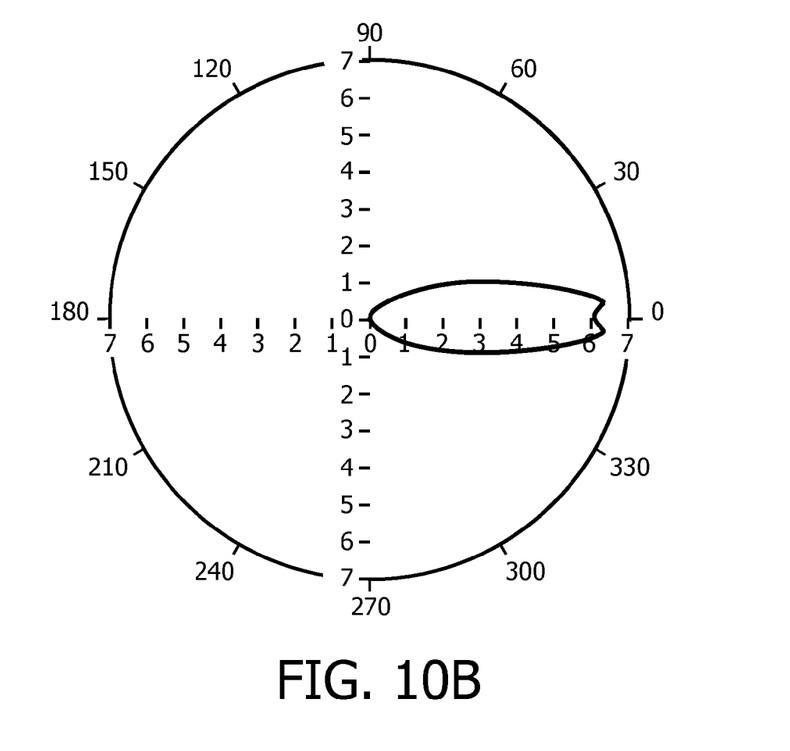

FIG. 10 schematically depicts a perspective view of the waveguide (2) of a further interesting embodiment of the invented illumination device (FIG. 10-A) and its intensity profile (FIG. 10-B). In this embodiment, the waveguide (2) is torus-shaped. The cross section of the waveguide (2) is identical to the one shown in FIG. 7. In more detail, the torus-shaped waveguide (2) comprises a curved surface (5), a flat surface (6) and an additional flat surface (14) acting as a light reflecting structure for beam-shaping. The light reflecting effect can be caused by the presence of a metal layer. This metal layer can be either a separate metal plate or a deposited metal layer (sputtering or evaporation). The use of aluminum is preferred for such a metal layer. On the flat surface (6), 4 LEDs (3) are positioned in a symmetrical manner. In this perspective view, only two of them are visible. FIG. 10-B shows the far field intensity light profile of an embodiment shown in FIG. 10A. In this profile, the light exits the waveguide in the z-direction (which is perpendicular to the plane defined by the LEDs (3)).

Advantageously, torus-shaped waveguides (2) are included in spot light luminaires in which rotationally symmetric intensity is required. Luminaires with illumination devices containing torus-shaped waveguides can also be integrated very advantageously in ceilings of offices. A preferred embodiment of such luminaire has the feature that it contains two torus-shaped waveguides of different radius. Such luminaires can be used for 'dual lighting' purposes.

Figure 11:
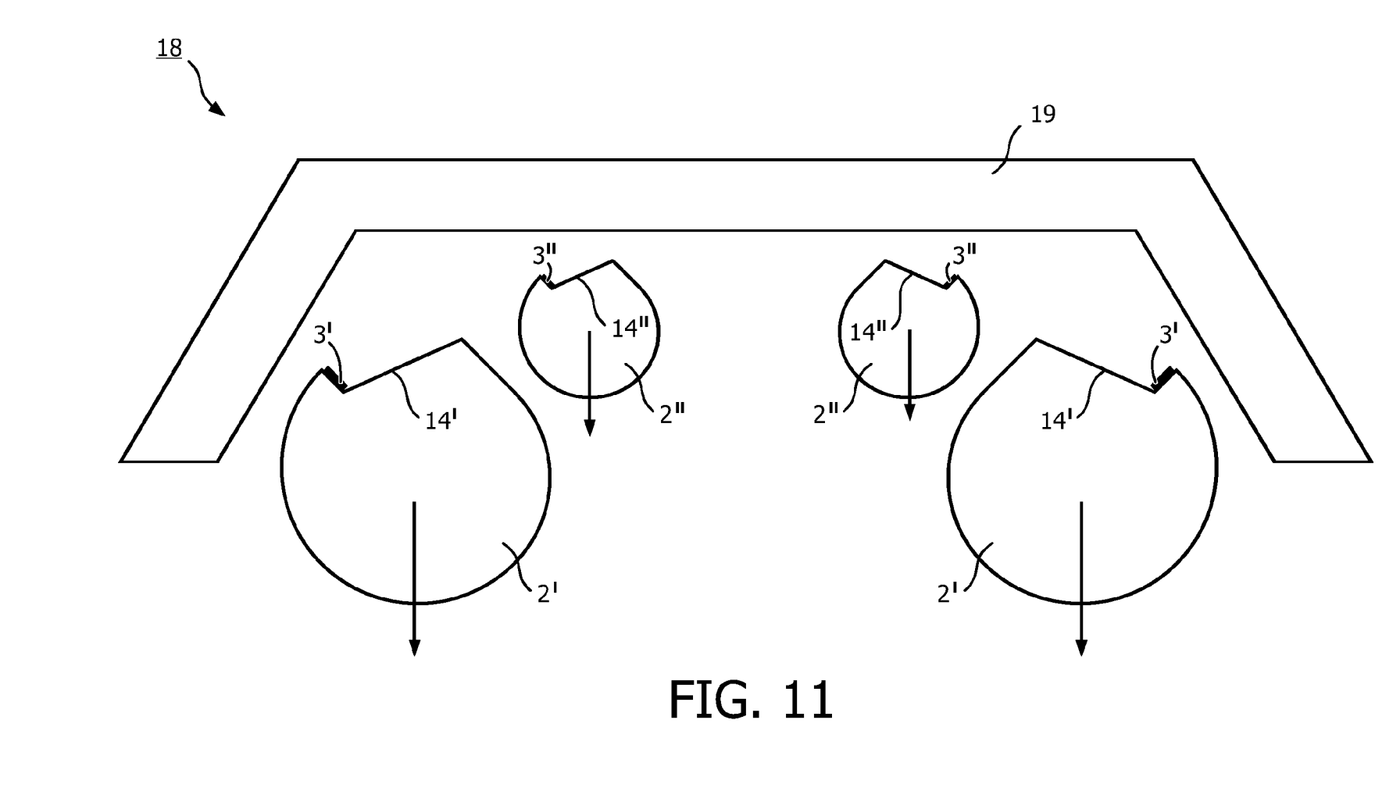
FIG. 11 shows a cross section of a luminaire according to the present invention.

FIG. 11 shows a cross section of a dual light luminaire (18) according to the present invention. This luminaire (18) comprises a housing (19) of metal or plastics and an illumination device. The illumination device contains two torus-shaped, optical waveguides (2' and 2") of different dimensions, as described in more detail in FIG. 10-A. The illumination device is attached to the housing in known manner, like clamping, screwing etc. The cross section of the waveguides (2' and 2") is essentially identical to the one shown in FIG. 7. A number of LEDs (3' and 3") have been positioned in a regular pattern on the flat entrance surface (6' and 6") of the waveguides (2' and 2"). Both waveguides (2' and 2") have been provided with a light reflective structure formed as an additional flat surface (14' and 14") provided with a reflection layer. In the present situation a thin layer of sputtered aluminum was used as reflection layer.

In dual light luminaire (18), schematically depicted in FIG. 11, both waveguides (2' and 2") in the illumination device are designed in such a manner that, upon activation of the LEDs, the exiting light is shaped such that it forms a circularly symmetric beam. Both beams are directed away from the housing (19), as indicated by the arrows. It is also possible to design one of the waveguides (2' or 2") in such a manner that its beam is directed towards the housing (19) and reflected back in a direction away from the housing (19).

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. An illumination device comprising an oblong optical waveguide and at least one light source positioned along the waveguide, said waveguide having a central axis at distance r to an outer surface of the waveguide, said outer surface comprising a light entrance surface on which the at least one light source is positioned and a curved light exit surface having a non-circular circumference,
    wherein, viewed along the circumference of the curved light exit surface, a first distance from the central axis to a first intersection formed by the light entrance surface and the curved light exit surface has a first value, and a second distance from the central axis to a second intersection formed by the light entrance surface and the curved light exit surface has a second value different from the first value, such that, during operation of the device, light escapes from the waveguide through the curved light exit surface in a plane which is substantially perpendicular to the central axis of the waveguide,
    wherein the light exit surface is structured such that, during operation of the device, the light, prior to escaping from the waveguide, both propagates around the central axis and is displaced in a direction parallel to the central axis.

2. The illumination device according to claim 1, wherein the waveguide comprises a channel extending substantially parallel to the central axis.

3. The illumination device according to claim 2, wherein an axis of the channel and the central axis of the waveguide do not coincide.

4. The illumination device according to claim 1, wherein the tangents to the curved light exit surface at both the first and second intersections are parallel to the normal to the light entrance surface.

5. The illumination device according to claim 1, wherein the distance r measured along the curved light exit surface continuously changes from said first value to said second value.

6. The illumination device according to claim 1, wherein the waveguide is provided with a light reflective structure.

7. The illumination device according to claim 1, wherein the waveguide further comprises another light entrance surface, said light entrance surfaces being located at substantially opposite locations of the waveguide.

8. The illumination device according to claim 1, wherein the waveguide comprises a solid rod formed of optically transparent material.

9. The illumination device according to claim 1, wherein the angle formed by the normal to the light entrance surface and the tangent to the curved light exit surface at the first intersection is less than 20°, and the angle formed by the normal to the light entrance surface and the tangent to the curved light exit surface at the second intersection is less than 20°.

10. The illumination device according to claim 1, wherein the light exit surface is structured such that, during operation of the device, said light, prior to escaping from the waveguide, propagates around the central axis a plurality of times during the displacement in the direction parallel to the central axis.

11. An illumination device, comprising:
    an oblong optical waveguide comprising an outer surface and a central axis at different relative distances to the outer surface, the outer surface comprising a curved light emitting surface and a light entrance surface, and the central axis provided along a length of the optical waveguide; and at least one light source positioned along the optical waveguide on the light entrance surface, wherein a first distance from the central axis to a first intersection formed by the light entrance surface and the curved light emitting surface is different from a second distance from the central axis to a second intersection formed by the light entrance surface and the curved light emitting surface, such that, during operation of the illumination device, light is internally reflected within the optical waveguide before escaping from the optical waveguide through the curved light emitting surface, wherein the light emitting surface is structured such that, during operation of the device, the light, prior to escaping from the waveguide, both propagates around the central axis and is displaced in a direction parallel to the central axis.

12. The illumination device of claim 11, wherein the light escapes from the optical waveguide via the curved light emitting surface in a plane substantially perpendicular to the central axis.

13. The illumination device of claim 11, wherein the light emitting curved surface has a non-circular circumference.

14. The illumination device according to claim 11, wherein the tangents to the curved light emitting surface at both the first and second intersections are parallel to the normal to the light entrance surface.

15. The illumination device according to claim 11, wherein the angle formed by the normal to the light entrance surface and the tangent to the curved light emitting surface at the first intersection is less than 20°, and the angle formed by the normal to the light entrance surface and the tangent to the curved light emitting surface at the second intersection is less than 20°.

16. An illumination device, comprising:

an optical waveguide having a central axis extending through the waveguide at distance r to an outer surface of the waveguide, the outer surface comprising a light entrance surface and a curved light exit surface having a non-circular circumference; and at least one light source positioned along the optical waveguide on the light entrance surface, wherein, viewed along the circumference of the curved light exit surface, a first distance from the central axis to a first intersection formed by the light entrance surface and the curved light exit surface has a first value, and a second distance from the central axis to a second intersection formed by the light entrance surface and the curved light exit surface has a second value different from the first value, such that, during operation of the device, light escapes from the waveguide through the curved light exit surface in a plane which is substantially perpendicular to the central axis of the waveguide, wherein the waveguide is torus-shaped, and wherein the light exit surface is structured such that, during operation of the device, the light, prior to escaping from the waveguide, both propagates around the central axis and is displaced in a direction parallel to the central axis.

17. The illumination device according to claim 16, wherein the light entrance surface is disposed at an inner circumference of said torus-shaped optical waveguide.

18. An illumination device comprising an oblong optical waveguide and at least one light source positioned along the waveguide, said waveguide having a central axis at distance r to an outer surface of the waveguide, said outer surface comprising a light entrance surface on which the at least one light source is positioned and a curved light exit surface having a non-circular circumference, wherein, viewed along the circumference of the curved light exit surface, a first distance from the central axis to a first intersection formed by the light entrance surface and the curved light exit surface has a first value, and a second distance from the central axis to a second intersection formed by the light entrance surface and the curved light exit surface has a second value different from the first value, such that, during operation of the device, light escapes from the waveguide through the curved light exit surface in a plane which is substantially perpendicular to the central axis of the waveguide, wherein at least part of the curved light exit surface corresponds to equation $r(\theta)=a+b\theta$, when describing said curved light exit surface in polar coordinates, wherein a and b are constants, $\theta$ is an angle about said central axis, and b is nonzero.

19. An illumination device comprising an oblong optical waveguide and at least one light source positioned along the waveguide, said waveguide having a central axis at distance r to an outer surface of the waveguide, said outer surface comprising a light entrance surface on which the at least one light source is positioned and a curved light exit surface having a non-circular circumference, wherein, viewed along the circumference of the curved light exit surface, a first distance from the central axis to a first intersection formed by the light entrance surface and the curved light exit surface has a first value, and a second distance from the central axis to a second intersection formed by the light entrance surface and the curved light exit surface has a second value different from the first value, such that, during operation of the device, light escapes from the waveguide through the curved light exit surface in a plane which is substantially perpendicular to the central axis of the waveguide, wherein at least part of the curved light exit surface corresponds to the equation $r(\epsilon)=a+\epsilon[b+c.\exp(-d.(\phi-\theta)^2)]$, when describing said curved light exit surface in polar coordinates, wherein a, b, c and d are constants, $\theta$ is an angle about said central axis, $\phi$ denotes a position on said curved light exit surface, and at least one of b or c is nonzero.

* * * * *